(12) United States Patent
Cercelaru

(10) Patent No.: US 8,989,679 B2
(45) Date of Patent: Mar. 24, 2015

(54) DUAL USE TRANSISTOR

(75) Inventor: Sever Cercelaru, Cannes la Bocca (FR)

(73) Assignee: Cambridge Silicon Radio Limited, Cambridge (GB)

( * ) Notice: Subject to any disclaimer, the term of this patent is extended or adjusted under 35 U.S.C. 154(b) by 401 days.

(21) Appl. No.: 13/387,311

(22) PCT Filed: Jul. 16, 2010

(86) PCT No.: PCT/EP2010/060358
§ 371 (c)(1),
(2), (4) Date: Feb. 23, 2012

(87) PCT Pub. No.: WO2011/012473
PCT Pub. Date: Feb. 3, 2011

(65) Prior Publication Data
US 2012/0139644 A1    Jun. 7, 2012

(30) Foreign Application Priority Data

Jul. 31, 2009  (GB) .................................. 0913445.3

(51) Int. Cl.
*H04B 1/40* (2006.01)
*H03F 3/72* (2006.01)
(Continued)

(52) U.S. Cl.
CPC ................. *H03F 3/72* (2013.01); *H03F 3/195* (2013.01); *H03F 3/245* (2013.01); *H03F 2200/09* (2013.01); *H03F 2200/18* (2013.01); *H03F 2200/216* (2013.01); *H03F 2200/24* (2013.01); *H03F 2200/27* (2013.01); *H03F 2200/294* (2013.01); *H03F 2200/378* (2013.01);
(Continued)

(58) Field of Classification Search
USPC .............. 455/73, 77, 78, 82, 83, 84; 370/280; 330/296
See application file for complete search history.

(56) References Cited

U.S. PATENT DOCUMENTS 5,305,469 A * 4/1994 Camiade et al. ................ 455/78
2004/0229573 A1* 11/2004 Krasser et al. .................. 455/73
(Continued)

FOREIGN PATENT DOCUMENTS

| WO | WO 2006/130969 A1 | 12/2006 | ............... H04B 1/38 |
| WO | WO 2009/106403 A1 | 9/2009 | ............... H04B 1/48 |

OTHER PUBLICATIONS

"International Search Report", mailed Oct. 26, 2010, PCT Application No. PCT/EP2010/060358.
"Intellectual Property Office Search Report", mailed Nov. 5, 2010, Application No. GB0913445.3.

*Primary Examiner* — Ping Hsieh
(74) *Attorney, Agent, or Firm* — Dergosits & Noah LLP

(57) ABSTRACT

A circuit for amplifying radio frequency signals comprising: a terminal for connection to an antenna; a common amplifier arranged in a common-gate configuration between a first node and said terminal; a transmit amplifier operable to amplify a radio frequency signal present at an input node and provide the amplified signal to said first node; and a receive amplifier operable to amplify a radio frequency signal present at said first node and provide the amplified signal to an output node; wherein the circuit is operable in two modes: in a receive mode, the common and receive amplifiers being configured so as to together form a receive cascode for amplifying radio frequency signals received at the terminal; and in a transmit mode, the common and transmit amplifiers being configured so as to together form a transmit cascode for amplifying radio frequency signals applied at the input node.

20 Claims, 2 Drawing Sheets

(51) Int. Cl.
*H03F 3/195* (2006.01)
*H03F 3/24* (2006.01)

(52) U.S. Cl.
CPC ..... *H03F2200/391* (2013.01); *H03F 2200/399* (2013.01); *H03F 2200/411* (2013.01); *H03F 2200/451* (2013.01); *H03F 2200/72* (2013.01); *H03F 2203/7206* (2013.01); *H03F 2203/7231* (2013.01)
USPC ................................ 455/84; 455/78; 330/296

(56) References Cited

U.S. PATENT DOCUMENTS

| 2008/0247338 | A1* | 10/2008 | Kim et al. ..................... 370/280 |
| 2009/0036065 | A1 | 2/2009 | Siu ................... 455/78 |
| 2009/0245411 | A1* | 10/2009 | Goldberg ...................... 375/267 |
| 2010/0027568 | A1 | 2/2010 | Rajendran et al. ............ 370/532 |

* cited by examiner

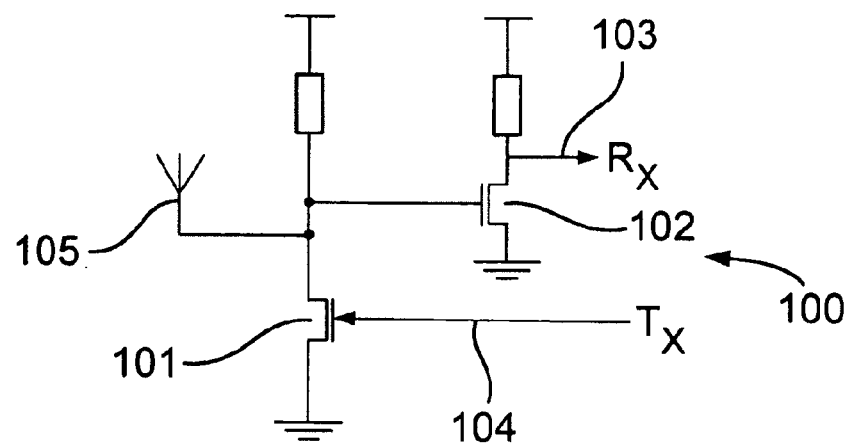
Fig. 1 -- Prior Art --
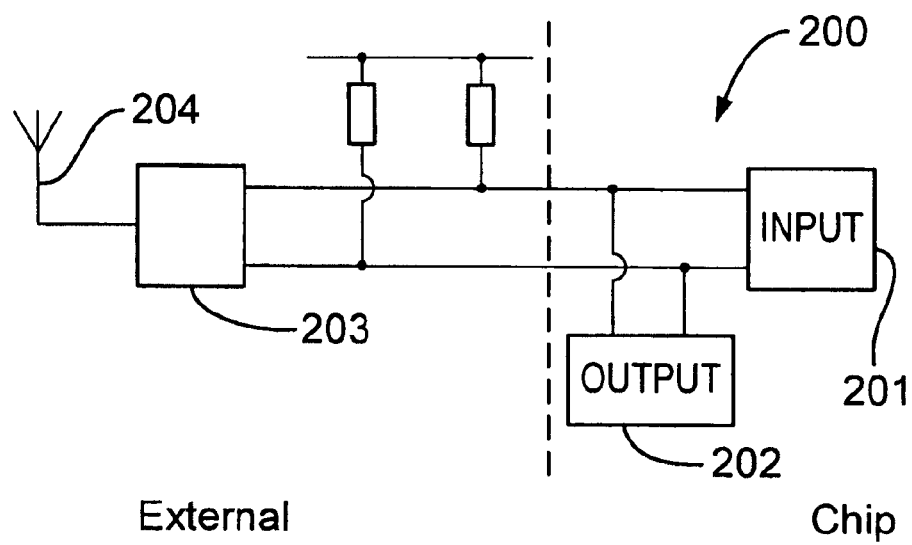
Fig. 2 -- Prior Art --
External · Chip

DUAL USE TRANSISTOR

CROSS REFERENCE TO RELATED APPLICATIONS

This application is a U.S. National Phase Application of International Application No. PCT/EP2010/060358, "Dual Use Transistor" filed Jul. 16, 2010 which claims priority to Great Britain Patent Application No. GB 0913445.3, "Dual Use Transistor" filed Jul. 31, 2009 which are both incorporated by reference.

BACKGROUND OF THE INVENTION

This invention relates to circuits for coupling an antenna to radio frequency transmit and receive circuitry.

In radio frequency (RF) communication devices it is often desirable to minimise the complexity and number of components required for RF communication. This generally reduces the cost, power consumption and PCB area consumed by the RF front-end which handles the physical transmission and reception of RF signals. These factors are especially important in portable devices, such as mobile telephones, PDAs and laptops.

It is particularly important to minimise the number of components external to the integrated circuits around which most RF communication devices are based because such components are expensive in terms of their intrinsic cost (in comparison to equivalent devices in an integrated circuit) and the PCB area they consume. Furthermore, these components are very often outside the Built-In Self Test (BIST) and calibration routines performed internally in the integrated circuit (IC).

Typically, an RF communication device will only have a single antenna for both signal transmission and signal reception. In such devices, the transmission and reception circuitry must be able to share the antenna and this is normally achieved through the use of one or more switches between the transmission/reception circuitry and the antenna. However, aside from the additional cost and PCB area consumed through the use of external switches, the additional parasitic capacitance of the switches makes them unsuitable for very high frequency radio communications (3 to 9 GHz). In particular, insertion losses associated with external switches degrade the overall sensitivity of the receive path and increase the power consumption of the transmit path.

A prior art circuit for coupling an antenna to transmit and receive circuitry is shown in FIG. 1. Such a circuit is typically used as the radio frequency front-end between an antenna and a radio transceiver. Circuit 100 can be switched between transmit and receive modes by controlling transistors 101 and 102. When the circuit is in transmission mode, transistor 102 is used to isolate the receive path from the antenna and transistor 101 is used to amplify radio frequency transmit signal 104 for transmission at antenna 105; when the circuit is in receive mode, transistor 101 is used to isolate the transmission path and transistor 102 is used to amplify signals received at antenna 105 and provide radio frequency receive signal 103. All of the components shown in FIG. 1 are typically discrete components external to an integrated circuit comprising the radio transceiver.

A second prior art circuit for coupling an antenna to transmit and receive circuitry is shown in FIG. 2. Receive circuitry 201 and transmit circuitry 202 together comprise a radio transceiver and are typically supported at a single integrated circuit. A balun or filter 203 is used to convert balanced transmit signals from transmit circuitry 202 into a single-ended output for antenna 204, and to convert a single-ended signal received at antenna 204 into a balanced input for receive circuitry 201. Again, one or more switches are used to switch between transmit and receive modes in circuit 200. When receive circuitry 201 is active, transmit circuitry 202 is isolated from the signal path, and when transmit circuitry 202 is active, receive circuitry 201 is isolated from the signal path.

Due to the use of additional components (such as switches and filters) in the signal path, it is difficult to reduce the parasitic capacitances present in the circuits to a level suitable for use with very high frequency radio signals above 3 GHz, and in particular between 6 and 9 GHz. Furthermore, the parasitic capacitances make it difficult to achieve acceptable input and output impedance matching over a wideband frequency range. The circuits shown in FIGS. 1 and 2 are therefore unsuitable for use with ultra-wideband (UWB) radio transceivers.

Additional problems exist with deep-submicron circuits (i.e. less than around a 90 nm process) which are the becoming the standard for modern communication ICs. Conventional circuits, such as the one illustrated in FIG. 1, experience reliability problems because of the large voltage swing at the common port (the antenna 105) when transmitting. The large voltage swing directly stresses low-signal devices in the receive path such as transistor 102.

There is therefore a need for an improved circuit design suitable for fabrication using a deep-submicron process for coupling radio frequency transmit and receive circuitry to an antenna. In particular, there is a need for a circuit for coupling radio frequency transmit and receive circuitry to an antenna which can be used at very high radio frequencies and with wideband radio transceivers.

SUMMARY OF THE INVENTION

According to a first aspect of the present invention there is provided a circuit for amplifying radio frequency signals comprising: a terminal for connection to an antenna; a common amplifier arranged in a common-gate configuration between a first node and said terminal; a transmit amplifier operable to amplify a radio frequency signal present at an input node and provide the amplified signal to said first node; and a receive amplifier operable to amplify a radio frequency signal present at said first node and provide the amplified signal to an output node; wherein the circuit is operable in two modes: in a receive mode, the common and receive amplifiers being configured so as to together form a receive cascode for amplifying radio frequency signals received at the terminal; and in a transmit mode, the common and transmit amplifiers being configured so as to together form a transmit cascode for amplifying radio frequency signals applied at the input node.

In receive mode the transmit amplifier is preferably off. In transmit mode the receive amplifier is preferably off.

The circuit preferably further comprises voltage biasing means coupled to said terminal and operable to regulate the DC voltage at the terminal, the voltage biasing means being configured to: in the receive mode, set the DC voltage at the terminal such that the common amplifier is arranged to amplify signals received at the antenna; in the transmit mode, set the DC voltage at the terminal such that the common amplifier is arranged to amplify signals received from the transmit amplifier. The DC voltage at the terminal may be set to a supply voltage of the common amplifier.

Preferably the voltage biasing means comprise a choke. Suitably the choke is coupled between a voltage source and said terminal. Preferably the choke is a printed waveguide.

In the receive mode, the gain of the receive cascode is preferably set in dependence on a common gate voltage applied to the gate of the common amplifier. Preferably the common gate voltage is selected so as to match the input impedance of the circuit with the impedance of the antenna.

Preferably, in the transmit mode, a common gate voltage is applied to the gate of the common amplifier sufficient to hold the common amplifier at or close to its maximum gain. The common gate voltage may be a supply voltage of the common amplifier.

Suitably the common gate voltage applied to the gate of the common amplifier is modified so as to modulate the amplitude of the transmitted signal in accordance with a predetermined amplitude modulation scheme. The common gate voltage may be modified in dependence on a load condition at the antenna and/or the estimated transmission power from the antenna.

Suitably, the receive amplifier is coupled to a tuneable resonant circuit such that, in the receive mode, the receive cascode preferentially amplifies radio frequency signals within a predetermined frequency of the resonant frequency of said resonant circuit.

Preferably the circuit further comprises a switch connected between the input node and a supply voltage of the circuit, the switch being configured to: in the receive mode, clamp the voltage at the input node to the supply voltage of the circuit so as to hold the transmit amplifier in its off state; in the transmit mode, isolate the voltage at the input node from the supply voltage of the circuit.

The common, receive and transmit amplifiers may be all n-type or all p-type field effect transistors with the supply voltages of the circuit being selected accordingly.

Preferably the circuit is an integrated circuit and the common amplifier is a double oxide MOSFET and the transmit and receive amplifiers are single oxide MOSFETs. Preferably the common amplifier operates at a higher supply voltage than the transmit and receive amplifiers.

Suitably the receive cascode forms a low noise amplifier. Suitably the transmit cascode forms a power amplifier.

DESCRIPTION OF THE DRAWINGS

The present invention will now be described by way of example with reference to the accompanying drawings, in which:

FIG. 1 shows a first prior art circuit for coupling an antenna to transmit and receive circuitry.

FIG. 2 shows a second prior art circuit for coupling an antenna to transmit and receive circuitry.

DETAILED DESCRIPTION OF THE DRAWINGS

Figure 3:
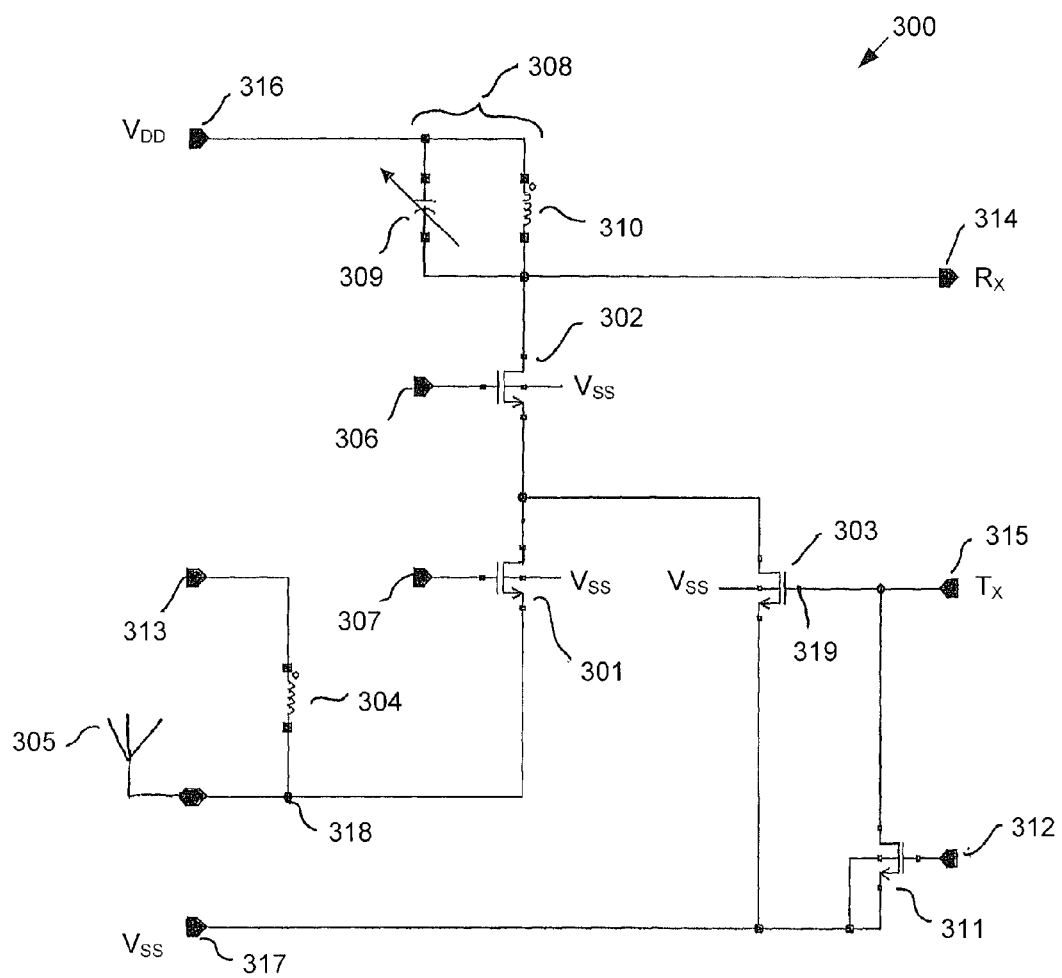
FIG. 3 is a schematic diagram of a circuit configured in accordance with the present invention.

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The present invention provides an improved radio-frequency (RF) front-end for wireless communication devices which does not require external switches in order to couple the transmit and receive paths to an antenna. In particular, no external switches are required for a wireless communication device performing time-division multiplexing (TDM). The invention further provides an RF front-end having low current consumption, low parasitic capacitances and which is efficient in terms of the number of passive components required. These advantages allow the circuit to be used in ultra-wideband (UWB) communication systems and at radio frequencies in excess of 3 GHz. The present invention is particularly suitable for use in the 5 GHz ISM band, such as with 802.11a transceivers.

A schematic diagram of a circuit configured in accordance with the present invention is shown in FIG. 3. Circuit 300 is arranged to couple antenna 305 to receiver circuitry 314 and transmit circuitry 315. A common amplifier 301 is active in both receive and transmit modes: in receive mode amplifiers 301 and 302 together form a low noise amplifier for the receive path, and in transmit mode amplifiers 301 and 303 form a power amplifier for the transmit path. Common amplifier 301 has a common gate configuration because this provides the symmetry necessary to allow the source and drain of the common amplifier to be interchangeable (the arrangement of the labels "source" and "drain" depends on whether the circuit is in receive or transmit mode, as described below). Furthermore, the common-gate amplifier configuration provides improved impedance matching and potentially lower noise amplification in receive mode. Amplifiers 302 and 303 may be any suitable amplifiers but in FIG. 3 the amplifiers are field-effect transistors (FETs). Common amplifier 301 is a FET device and preferably a MOSFET.

By controlling the gate voltage 307 of amplifier 301 and the bias voltage at the antenna side of amplifier 301, the common amplifier can be switched between operating as a low noise amplifier (in receive mode) and a power amplifier (in transmit mode). In FIG. 3, choke 304 is used to provide a DC bias at the antenna side of common amplifier 301, but other components could be used achieve a DC bias at the expense of performance. Advantageously, choke 304 has a high impedance at the radio frequencies at which circuit 300 operates but can pass through a DC bias voltage 313 to the signal path which extends between antenna 305 and common amplifier 301. At higher frequencies (especially above 3 GHz), the choke is preferably fabricated as a waveguide structure, such as a quarter-wavelength transmission line. Such transmission lines have the additional advantage that they can be fabricated using a printing process. This allows them to be readily incorporated into a printed circuit board supporting a circuit of the present invention.

Voltage at port 313 is preferably generated internally in the same integrated circuit that includes circuit 300. Voltage 313 is preferably generated by a power buffer able to deliver both low-voltage (close to Vss) in receive mode and high-voltage (close to Vdd) in transmit mode. Circuit 300 has been fabricated with such a power buffer having a low output impedance of less than 2Ω. The buffer is configured to deliver a low or high voltage to input 313 appropriate to the transceiver mode. The (or other) power buffers may be supply the appropriate voltages at nodes 306, 307, and 312.

The receive and transmit modes will now be described in turn with reference to FIG. 3.

In receive mode, choke 304 is arranged to pull down the common amplifier input 318 to or close to the lower supply voltage, Vss and the gate voltage 307 of the common amplifier is set to a bias value intermediate between the upper and lower supply voltages. The bias value is set so as to obtain the desired transconductance, Gm. To complement the configuration of common amplifier 301, the gate voltage 306 of receive amplifier 302 is set at or close to the upper supply voltage Vdd. (Typically the gate voltage is 90, 95, 98 or 100% of the upper supply voltage.) In this manner, common amplifier 301 and receive amplifier 302 together form a receive cascode whose gain and input impedance may be adjusted by means of the bias voltage applied to gate 307 of the common amplifier. It is advantageous in terms of receive sensitivity if the gate voltage 307 is set to the optimum bias value which balances the gain provided by the low noise amplifier (LNA) formed from amplifiers 301 and 302 with the noise level at the LNA output (the input for receive circuitry 314).

A tunable load 308 is provided in the receive path so as to allow receive circuitry 314 to tune the circuit to the required radio frequency band. However, the tunable load need not be arranged as shown in FIG. 3 and could be integrated into receive circuitry 314. Typically, tunable load 308 comprises an inductor 310 and a variable capacitor 309, which have values appropriate to the region of the radio frequency spectrum in which the circuit is required to operate. In the case that receive circuitry 314 is arranged to receive a differential input, tunable load 308 is preferably implemented as a balun so as to provide a suitable interface between the single ended receive path and differential receive circuitry 314.

Transmit amplifier 303 is switched off so as to isolate the transmit path from the receive path. This can be achieved at the transmit circuitry by applying a low voltage at the gate of amplifier 303, but the isolation of receive and transmit paths can be improved through the optional use of a switch 311 to clamp the transmit path to ground. This is important because the same local oscillator is often used to drive both receive and transmit circuitry; leakage of the local oscillator from the transmit path into the receive path can therefore seriously affect the performance of the receive circuitry. Thus, a suitable bias voltage is applied at gate 312 to close switch 311 between Vss and the transmit path.

In transmit mode, choke 304 is arranged to pull up the common amplifier output 318 to or close to the upper supply voltage, Vdd and the gate voltage 307 is also set to or close to the upper supply voltage, Vdd so as to bring the common amplifier into a power amplifier configuration. ("Close to" here again should be understood to mean 90, 95, 98 or 100% of the upper supply voltage.) However, as noted below, gate 307 may be used as an AM port in transmit mode and therefore the gate voltage may not always be close to the upper supply voltage. The receive path is isolated from the transmit path by setting the gate voltage 306 of receive amplifier 302 to ground—gate voltage 306 could be clamped to ground by a switch configured in an analogous fashion to switch 311 in the transmit path. In this manner, common amplifier 301 and transmit amplifier 303 together form a transmit cascode (a power amplifier) which takes as its input 319 the radio frequency transmit signal from transmit circuitry 315. Switch 311 (if present) is of course open in transmit mode so as to isolate input 319 from the lower supply voltage 317.

In comparison to receive mode, in transmit mode the source and drain of common gate amplifier 301 are reversed and the common amplifier input 318 becomes the common amplifier output 318. The size of common amplifier 301 is preferably selected so as to provide a balance between (a) the gain provided in transmit mode by the power amplifier comprising amplifiers 301 and 303 with (b) the noise level of the low noise amplifier comprising amplifiers 301 and 302 in receive mode. Furthermore, the size of amplifiers 301, 302 and 303 should be selected so as to provide acceptable impedance matching between the antenna and circuit 300 in both transmit and receive modes.

The size of common amplifier 301 is primarily determined by the required maximum output power in transmit mode. Thus, the common amplifier is generally sized so as to at maximum gate bias provide the required maximum transmission power.

In receive mode, the gate bias of transistor 301 is selected so as to match the antenna impedance. For example, if the antenna impedance is 50Ω, the transconductance of the common amplifier, $G_m$, is set to 20 mS (because the input impedance of the receive circuit is $1/G_m$). Amplifier 302 is then sized so as to minimise the parasitic impact on the load tank 308, although generally amplifier 302 has comparable size to amplifier 301.

Amplifier 303 is sized so as to balance the drive of common amplifier 301 with the power consumption from transmit circuitry 315. In other words, since amplifier 303 provides buffering on the transmit path, the amplifier is sized so as to optimise the drive of common amplifier 301 whilst maintaining a low power consumption from transmit circuitry 315 (i.e. at a power level which the transmit circuitry can comfortably provide).

It is possible to adjust the gain of the power amplifier in transmit mode by controlling the bias voltages at output 318 and gate voltage 307: by lowering these voltages (they need not be the same) from the upper supply voltage the gain of the power amplifier can be reduced. Thus, the bias voltage of ports 313 or 307 can be used to modulate the amplitude of the output signal in transmit mode. The transmitter can therefore be part of an AM modulator or more complex transmitter, such as a transmitter having a polar architecture. Polar architectures can be full analogue implementations, such as Envelope Elimination and Restoration (EER), or mixed-mode, such as TI DRP-E (a digital radio processor for EDGE communications).

It is preferred that only gate bias 307 is used to modulate the amplitude of the output signal. This has been shown to be more efficient and provide better transmit performance. The use of amplitude modulation in signal transmission is particularly advantageous in deep sub-micron ICs, and has demonstrated excellent performance in circuits fabricated using a 40 nm process. Amplitude modulation schemes—which generally use predetermined algorithms to respond to signal changes and antenna conditions, to give two examples—can improve transmitter performance through the use of a modulation circuit at the modulation port of the transmitter front-end. In the circuit illustrated in FIG. 3, the modulation port is gate 307.

In the case that transmit circuitry 315 is arranged to provide a differential output to circuit 300, the power amplifier input 319 is preferably delivered as a balun, which provides a suitable interface between the single ended transmit path and differential transmit circuitry 315.

Circuit 300 can be switched between receive and transmit modes by simply changing the bias voltages at points 313, 307, 306 and (optionally) 312. The circuit can therefore be readily configured to operate in accordance with a time-divided communication standard. It will be apparent to the skilled person that the circuit can be readily extended to accommodate inputs from more than one transmit channel and/or to provide outputs to more than one receive channel. Similarly, the circuit can be extended to couple an antenna with multiple receive and transmit circuits. For example, the circuit could couple both Bluetooth and IEEE 802.11 circuitry to a common antenna.

It is most preferable that circuit 300 is fabricated as an integrated circuit (IC) which also comprises the receive and transmit circuitry. The present invention therefore allows all of the RF and signal processing circuitry required to support communications of a particular protocol to be provided in a single chip. Indeed, the chip could support multiple communication protocols. For example, a single chip could incorporate Bluetooth and IEEE 802.11 functionality and provide a radio frequency output for an antenna at an output (pin) of the chip. Choke 304 could be external to an IC comprising the remainder of circuit 300 but preferably the choke too is fabricated as an integral part of the IC or within the chip packaging.

Receive circuitry 314 and transmit circuitry 315 should be understood as referring to any components arranged to accept a radio frequency signal from the antenna and to provide a radio frequency signal to the antenna, respectively. Antenna 305, receive circuitry 314, and transmit circuitry 315 do not form part of circuit 300 and are included for clarity. Antenna 305 can represent multiple antennas, each of which may have one or more elements, and there may be additional circuitry between input/output 318 and antenna 305. It should also be noted that the receive and transmit circuitry may comprise circuits for shifting the radio frequency signals to/from an intermediate frequency at which signal processing is performed.

The present invention therefore combines a low noise receive amplifier and a power amplifier into a radio frequency circuit based around a single optimised device, common amplifier 301. The circuit provides several advantages over conventional radio frequency front-end circuits which use one or more switches to switch an antenna between transmit and receive signal paths:
1. lower parasitic capacitance at critical points along the signal paths allows the circuit of the present invention to be used at high radio frequencies;
2. lower current consumption for equivalent performance in both transmit and receive modes;
3. efficient use of components and therefore chip or circuit board area;
4. additional radio frequency switches are not required to switch between transmit and receive signal paths.

Using choke 304 to provide a DC bias at the input/output 318 of common amplifier 301 provides a circuit having a high power efficiency in transmit mode. Using a resistive load at 318 in the circuit would waste transmission power. Furthermore, in receive mode the use of an inductive load is also important because a resistive load would generate thermal noise at the input of the circuit, degrading the noise performance of the radio receiver. It is therefore important to use an inductive load in both receive and transmit modes. Since an inductive load can be fabricated using a printed waveguide structure, the circuit is well suited to fabrication in a low voltage, deep-submicron IC.

It will be readily apparent to the skilled person that either n-type (as shown in FIG. 3) or p-type transistors can be used to construct a circuit in accordance with the present invention, with the bias and supply voltages being modified as appropriate (i.e. if p-type transistors are used, the upper supply voltages described above become lower supply voltages, etc.).

Circuits configured in accordance with the present invention have demonstrated excellent performance at frequencies of up to 9 GHz with a circuit having a power output of 8 dBm in transmit mode (i.e. from the power amplifier). Furthermore, these circuits can be used as a radio frequency front-end for ultra-wideband communication standards having a bandwidth of approximately 3 GHz.

The circuit set out in FIG. 3 has been fabricated using a 90 process and has shown to have excellent performance in both transmit and receive modes. Over a frequency range from 6.336 GHz to 8.976 GHz the circuit exhibited a receive gain of 18 dB with a noise level of 2 dB. The circuit consumed only 6 mA from the 1.3 V supply. In terms of transmit characteristics, the circuit demonstrated an output power of +10 dBm (at 7 dB compression) and consumed only 10 mA from the 1.3 V supply when delivering +7 dBm output power (from a maximum of +10 dBm).

At 90 nm, the transistor widths used were 160 µm for the common amplifier 301, 120 µm for amplifier 302, and 80 µm for amplifier 303 (all having lengths of 0.1 µm). Amplifier 302 has a slightly smaller size than amplifier 301 so as to reduce the drain parasitic capacitance experienced by tank circuit 308. The tank circuit itself comprised a balun 310 having k=0.8 and capacitor 309, which was implemented as a capacitive DAC with 20 fF step size. The same circuit has also been shrunk down to a 40 nm process size, illustrating the ability of a circuit configured in accordance with the present invention to be fabricated into very low power circuits.

A particularly advantageous embodiment of the present invention will now be described in which common amplifier 301 is fabricated as a dual oxide (DO) MOSFET and amplifiers 302 and 303 are fabricated as conventional single oxide (SO) MOSFETs. This enables the use of a higher supply voltage for amplifier 301 than for amplifiers 302 and 303. For example, in a 40 nm circuit, the supply for common amplifier 301 is directly attached to a 1.8V supply, providing 12 dBm output power. This power level cannot be achieved with conventional, single-oxide (SO) devices. Since the radio frequency drive (303) and cascade (302) amplifiers are conventional SO devices, the circuit maintains good efficiency for analogue processing at high frequencies. This is an elegant manner to interface circuitry operating at standard supply voltage (typically, 1.2V for 40 nm devices) with a higher supply voltage domain (typically 1.8V for 40 nm devices). Generally this is straightforward to arrange because the "peripheral" supply voltage in devices (particularly mobile devices) is often at a higher voltage than the voltage at which individual ICs operate. The dual-oxide device is also more robust with respect to electrical shocks (or ESD events) at the antenna port.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit for amplifying radio frequency signals comprising:
   a terminal for connection to an antenna;
   a common amplifier arranged in a common-gate configuration between a first node and said terminal;
   a transmit amplifier operable to amplify a radio frequency signal present at an input node and provide the amplified signal to said first node; and
   a receive amplifier operable to amplify a radio frequency signal present at said first node and provide the amplified signal to an output node;

wherein the circuit is operable in two modes:
  in a receive mode, the common and receive amplifiers being configured so as to together form a receive cascode for amplifying radio frequency signals received at the terminal; and
  in a transmit mode, the common and transmit amplifiers being configured so as to together form a transmit cascode for amplifying radio frequency signals applied at the input node and wherein a common gate voltage applied to the gate of the common amplifier is modified so as to modulate the amplitude of a transmitted signal in accordance with a predetermined amplitude modulation scheme.

2. A circuit as claimed in claim 1, wherein in receive mode the transmit amplifier is off.

3. A circuit as claimed in claim 1, wherein in transmit mode the receive amplifier is off.

4. A circuit as claimed in claim 1, further comprising voltage biasing means coupled to said terminal and operable to regulate the DC voltage at the terminal, the voltage biasing means being configured to:
  in the receive mode, set the DC voltage at the terminal such that the common amplifier is arranged to amplify signals received at the antenna;
  in the transmit mode, set the DC voltage at the terminal such that the common amplifier is arranged to amplify signals received from the transmit amplifier.

5. A circuit as claimed in claim 4, wherein the DC voltage at the terminal is set to a supply voltage of the common amplifier.

6. A circuit as claimed in claim 5, wherein the voltage biasing means comprise a choke.

7. A circuit as claimed in claim 6, wherein the choke is coupled between a voltage source and said terminal.

8. A circuit as claimed in claim 6, wherein the choke is a printed waveguide.

9. A circuit as claimed in claim 1, wherein, in the receive mode, the gain of the receive cascode is set in dependence on a common gate voltage applied to the gate of the common amplifier.

10. A circuit as claimed in claim 9, wherein the common gate voltage is selected so as to match the input impedance of the circuit with the impedance of the antenna.

11. A circuit as claimed in claim 1, wherein, in the transmit mode, a common gate voltage is applied to the gate of the common amplifier sufficient to hold the common amplifier at or close to its maximum gain.

12. A circuit as claimed in claim 11, wherein the common gate voltage is a supply voltage of the common amplifier.

13. A circuit as claimed in claim 1, wherein the common gate voltage is modified in dependence on a load condition at the antenna and/or the estimated transmission power from the antenna.

14. A circuit as claimed in claim 1, wherein the receive amplifier is coupled to a tuneable resonant circuit such that, in the receive mode, the receive cascode preferentially amplifies radio frequency signals within a predetermined frequency of the resonant frequency of said resonant circuit.

15. A circuit as claimed in claim 1, further comprising a switch connected between the input node and a supply voltage of the circuit, the switch being configured to:
  in the receive mode, clamp the voltage at the input node to the supply voltage of the circuit so as to hold the transmit amplifier in its off state;
  in the transmit mode, isolate the voltage at the input node from the supply voltage of the circuit.

16. A circuit as claimed in claim 1, wherein the common, receive and transmit amplifiers are all n-type or all p-type field effect transistors and the supply voltages of the circuit are selected accordingly.

17. A circuit as claimed in claim 1, wherein the circuit is an integrated circuit and the common amplifier is a double oxide MOSFET and the transmit and receive amplifiers are single oxide MOSFETs.

18. A circuit as claimed in claim 17, wherein the common amplifier operates at a higher supply voltage than the transmit and receive amplifiers.

19. A circuit as claimed in claim 1, wherein the receive cascode forms a low noise amplifier.

20. A circuit as claimed in claim 1, wherein the transmit cascode forms a power amplifier.

* * * * *